United States Patent [19]

Mizuishi

[11] Patent Number: 4,974,769
[45] Date of Patent: Dec. 4, 1990

[54] METHOD OF JOINING COMPOSITE STRUCTURES

[75] Inventor: Kenichi Mizuishi, Hachioji, Japan

[73] Assignee: Hitachi, Ltd., Tokyo, Japan

[21] Appl. No.: 343,781

[22] Filed: Apr. 27, 1989

[30] Foreign Application Priority Data

Apr. 28, 1988 [JP] Japan .................. 63-103916

[51] Int. Cl.⁵ ............................. B23K 31/02
[52] U.S. Cl. .................. 228/219; 228/121; 228/122
[58] Field of Search ............ 228/122, 121, 219; 156/312, 285, 286

[56] References Cited

U.S. PATENT DOCUMENTS 3,884,007  5/1975  Thoman ..................... 156/60 X
4,159,221  6/1979  Schuessler .................. 156/286
4,836,434  6/1989  Takenaka et al. ............ 228/219

FOREIGN PATENT DOCUMENTS 15973  2/1976  Japan .
29155  2/1986  Japan .

Primary Examiner—Kenneth J. Ramsey
Attorney, Agent, or Firm—Antonelli, Terry, Stout & Kraus

[57] ABSTRACT

A method and apparatus for integrally joining at least two composite structures using a bonding material which will melt under heating, with a method comprising the steps of heat-melting the bonding material interposed between the composite structures disposed opposite to each other, changing at least once the pressure of the atmospheric gas surrounding the bonding material in a fused state in a reciprocative manner between an initial pressure and pressure different therefrom, and solidifying the fused bonding material.

9 Claims, 3 Drawing Sheets

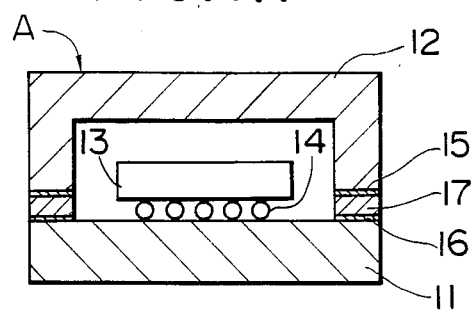
FIG. IA
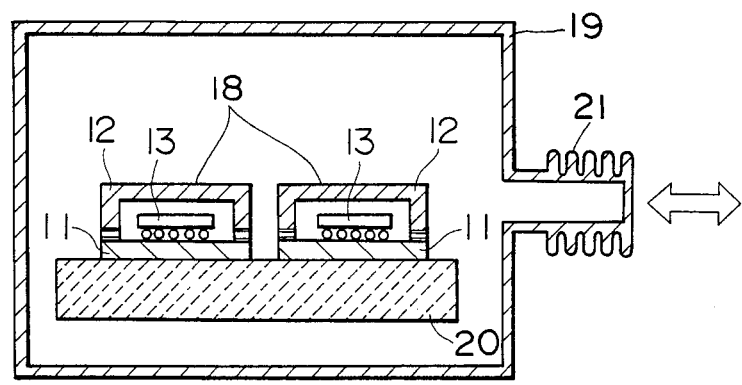
FIG. IB
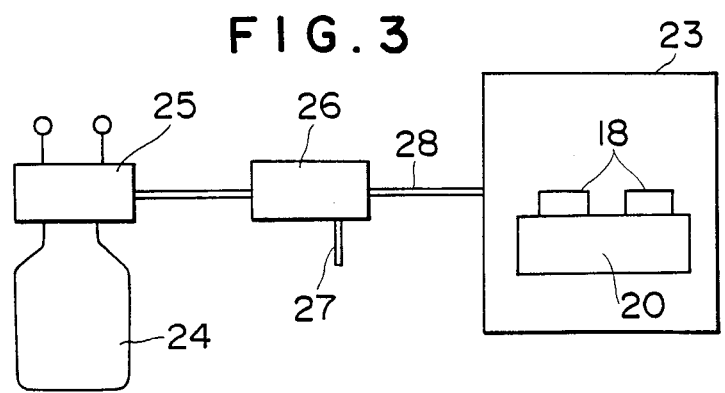
FIG. 3

THICKNESS OF SOLDER LAYER, D (mm)

METHOD OF JOINING COMPOSITE STRUCTURES

BACKGROUND OF THE INVENTION

The present invention relates to a method of joining composite structures, and, more particularly, to a joining method suitable for hermetic sealing of a package having narrow sealing surfaces.

Semiconductor devices such as IC, LSI and so on are received in sealed packages charged with an inactive gas for the purpose of protecting the devices from the atmosphere. Examples of sealing packages are respectively disclosed in Japanese Patent Unexamined Publication (Tokkaisho) No. 51-15973 and No. 61-29155. In Japanese Patent Unexamined Publication No. 51-15973, each of the metal foundation films, respectively provided as wiring films on sealing planes provided for seal-joining the external structural members of a package together, is divided into a plurality of separated zones. A solder film, interposed as a sealing material between the opposite metal foundation films, is also divided to correspond with the plurality of zones of the metal foundation film. Undesirable voids produced in the soldering film are therefore also divided into portions of a small volume. If the solder film is not divided into a plurality of zones, a single large void occurs in the soldering film, resulting in a reduction in the hermetic sealing performance.

In Japanese Patent Unexamined Publication No. 61-29155, many through holes or small grooves are formed in the sealing plane over the entire periphery of a cap, which is one of the external constitutive members of a package. Such through holes or small grooves open the voids produced in the solder film provided on the sealing plane and thus allow gases in the voids to escape enabling a manufacturing of products without any voids and bringing about an improvement in the hermetic sealing effect.

A common problem of the above-described techniques is particularly prevalent in applications in which the width of each of the sealing planes is reduced. There is a demand for a reduction in the width of each of the sealing planes in a small package in which a large-scale integrated circuit chip used for a high speed computer is sealed. A reason for this is that high density packing in which many small packages are mounted adjacent to each other on one wiring board leads to a reduction in the speed of electrical signals due to the fact that the wiring length, which corresponds to the thickness of the package side wall being equal to the width of each sealing surface, is added to the wiring length between respective chips. In addition, complicated processing must be performed in the portions of the sealing planes of chips designed for such applications. Thus, the above-described prior art cannot be easily realized when the size of a package is reduced to the size of a chip.

SUMMARY OF THE INVENTION

Thus, it is an object of the present invention to provide a method of joining composite structures which enables even a package having narrow sealing surfaces to be hermetically sealed while exhibiting excellent productivity and reliability in response to the above-described demand for a reduction in the size of packages.

In order to achieve this object, according to the present invention, a method of integrally joining at least two composite structures using a bonding material which will melt under heating is proposed, with the method comprising heat-melting the bonding material interposed between the structural members which are disposed opposite to each other, changing at least once the pressure of the atmospheric gas surrounding the bonding material in a fused state in a reciprocative manner between an initial pressure and a pressure different therefrom, and solidifying the fused bonding material. An inactive gas is used as the atmospheric gas, and use of inert gas or nitrogen gas is particularly preferable.

This method is particularly suitable for producing a package in which a large-scale integrated circuit chip used for a high speed computer is hermetically sealed and involves hermetically joining together as one unit a substrate which is one of the composite structures and a cap which is the other composite structure.

In accordance with further features of the present invention, at least two composite structures may be joined together as one unit by a bonding material which will melt under heating, with a heating means heating the composite structures together with the bonding material interposed therebetween. The composite structures and the heating means are contained in a sealable chamber, and and an apparatus is provided for joining the composite structures including a pressure control means for changing the gas pressure in the chamber In the joining method of the present invention, a soldering film, in contact with package sealing planes, is periodically vibrated with a small amplitude by utilizing a rhythmical change in the pressure of the atmospheric gas, and thus the oxide film on the surface of the soldering films on the sealing planes are broken. The gases in the voids produced in the soldering film are therefore released to the outside, whereby solder wettability is significantly increased. A satisfactory effect in terms of hermetic sealing is thus realized for a package with narrow sealing planes.

The details of the present invention will be made clear by a reading of the description of embodiments given below with reference to the accompanying drawings

BRIEF DESCRIPTION OF THE DRAWINGS

FIG. 1A is a schematic cross-sectional view of the soldering process used in an embodiment of the present invention;

FIG. 1B is an explanatory view of the form in which a sealing solder is rhythmically moved in a chamber;

FIG. 3 is a schematic view of a second embodiment of the present invention;

DESCRIPTION OF THE PREFERRED EMBODIMENTS

Figure 2A:
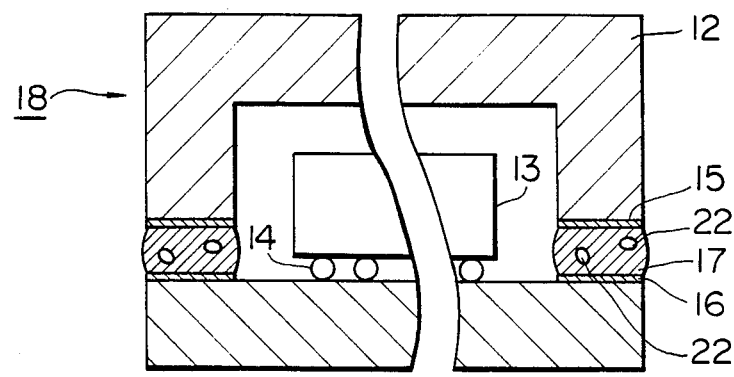
FIG. 2A is a schematic cross-sectional view of the state wherein solder is fused at the joint of a package.

Referring now the drawings when like reference numerals are used throughout the various views to designate like parts and, more particularly, to FIG. 1A, according to this FIG., a plate-shaped lead base 11 made of mullite ceramic, has joined thereto a vessel-shaped cap 12 made of Kovar (trade name, an alloy composed of 23 to 30 wt% of Ni, 30 to 17 wt% of Co, 0.6 to 0.8 wt% of Mn and Fe representing the balance and exhibiting a low coefficient of thermal expansion that approximates to the value of hard glass) or aluminum nitride. A large-scale integrated circuit chip 13 having the size of, for example, a 10 mm square, is contained in the chamber defined by the lead base 11 and the cap 12. In regard to the size of the cap 12, the dimensions of the top surface "A" may be, for example, 12×12 mm, and the thickness of the wall 0.5 mm, corresponding to the size of the 10 mm square chip 13. The chip 13 is previously joined to the lead base 11 through solder bumps 14 (95 wt% Pb-Sn) retaining electric conductivity, and a driving current and transfer of electrical signals are applied to it through lead terminals (not shown).

In the process shown in FIG. 1A, the metallized foundation plane 15 (metallized with gold) for sealing of the cap 12 and the metallized foundation plane 16 (metallized with gold) for sealing are joined together through a lead-tin (38 wt% Pb) solder layer 17. The solder layer 17 is formed by previously attack-soldering one or both of the metallized planes 15, 16, or by interposing a solder preform having the shape of a sealing plane between the metallized planes 15 and 16. When this process is completed, if no measures are taken to prevent the occurrence of voids in the solder layer 17 and of fine leak paths at the boundaries between the metallized planes 15, 16 and the solder layer 17, it will be readily confirmed that bad hermetic sealing, which is a problem of conventional methods, results and particularly that the frequency with which bad sealing occurs increases as the width of the sealed plane decreased to 0.5 mm or less.

In FIG. 1B, the packages 18, only two of which are shown in the drawing, after having been processed in the manner described hereinabove in connection with FIG. 1A, are placed in a chamber 19 which is then filled with an inactive gas and sealed. The packages 18 are then heated by a heater 20 so as to plane the solder layer 17 in a fused state. In this state, the pressure of the inactive gas in the chamber 19 is slightly increased and then returned to the initial value, this operation being repeated. This operation can be realized by rhythmically repeating compression of a bellows 21 provided on the side wall of the chamber 19 in the direction shown by the arrow. A similar operation can be performed by using a compressor. In this process, a rhythmical movement of the fused solder layer 17 in which it is slightly moved and then returned is repeated for each of the packages 18 in correspondence with the change in pressure of the inactive gas. At this time, the range of movement of the solder layer 17 can be easily controlled by changing the degree of compression of the bellows 21.

Figure 2B:
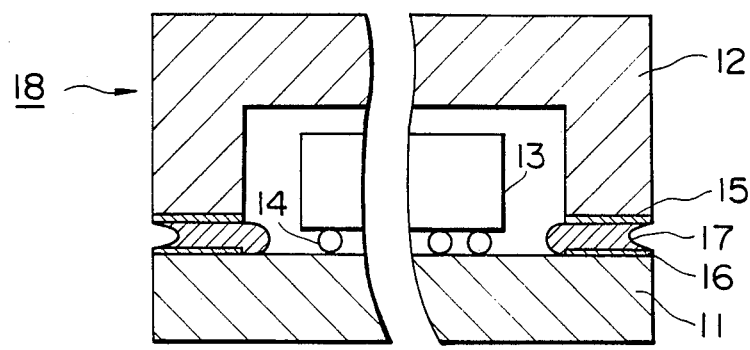
FIG. 2B is a schematic cross-sectional view of the state wherein the fused solder at the joint is subjected to pressure.

The solder layer 17 is fused in the step shown in FIG. 2A and it is moved by increasing the pressure of the inactive gas surrounding the package 18 by a necessary value in the step shown in FIG. 2B. In the step shown in FIG. 2C, the external pressure is returned to the initial pressure (that is, the compression of the bellows 21 is stopped) so that the solder layer 17 is returned to the initial position. In the process in which this series of steps are repeated the necessary number of times at a given speed, natural oxidized films (not shown), respectively produced on the surfaces of the solder layer, are broken. Therefore, the wettability at the boundaries between the metallized planes 15, 16 and the solder layer 17 is increased, the occurrence of fine leak paths (not shown) is prevented, and the voids 22 (FIG. 2A), included in the solder layer 17, are released.

Figure 2C:
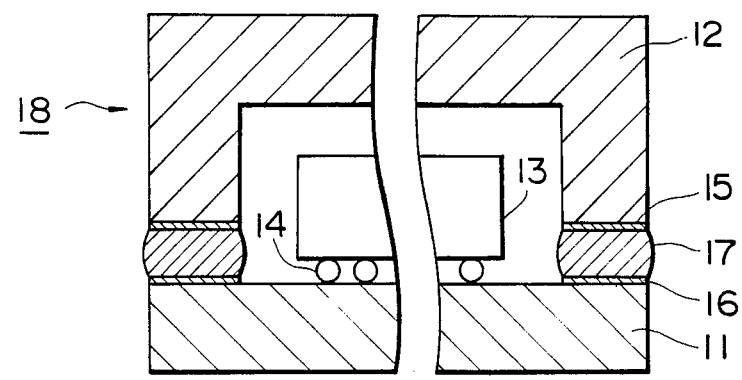
FIG. 2C is a schematic cross-sectional view of the state wherein joining is completed.

FIG. 2C shows the state wherein the packages 18 are separated from the chamber 19 shown in FIG. 1B after the solder layer has been solidified by stopping heating and hermetic sealing of the packages has been completed.

In this embodiment, although the increased pressure of the inactive gas in the chamber 19 is returned to the initial pressure when the solder layer 17 is solidified, the method of changing the pressure is not limited to this method. For example, in the above-described embodiment, the increased pressure may be not returned to the initial pressure, and the degree with which the pressure is returned may be reduced so that the solder layer 17 displaced is hardly moved. Alternatively, the pressure may be changed in the reversed order in such a manner that the pressure is first reduced and then increased.

The above-described embodiment enables the removal of fine leak paths and voids even in a small package with narrow sealing planes and thus enables a hermetic sealing that can be easily achieved with good reliability. The embodiment also enables collective hermetic sealing of many packages 18 thereby increasing the productivity. In this embodiment, the lead base is formed by using $Al_2O_3$, mullite ceramics, glass ceramics or the like, and the cap is formed by using one of these ceramics and metal materials. Examples of sealing materials that may be used include lead-tin alloys, as well as gold-tin type and gold-silicon type low-melting point solders and bonding materials such as silver solders which have relatively high melting points. In other words, the method of hermetically sealing packages of the present invention is capable of exhibiting its effect regardless of the kinds of constitutive materials of the packages. In addition, although the pressure of the inactive gas in the chamber 19 is generally set to atom, the pressure can be set to other values, if required. Although the inactive gas used is dry nitrogen gas which is the same FIG. 3 provides an example of a hermetic sealing apparatus which enables the control of amplitude conditions for the solder layer 17 used for hermetic sealing in the embodiment shown in FIG. 2A. As shown in FIG. 3, the packages 18 are mounted on a heater 20 in a chamber 23 in the same way as in the chamber 19 shown in FIG. 1B. Helium gas is used as atmospheric gas in the chamber 23 with the helium gas being press charged in a bomb 24, and the pressure thereof set by a pressure reducing valve 25. The helium gas can be introduced into the chamber 23 from piping 28 through an electromagnetic valve 26. The electromagnetic valve 26 is so designed that the valve 26 can be opened and closed by applying a pulse signal to the valve 26 from an electronic circuit (not shown). In an open state, the helium gas pressed is introduced into the chamber 23, and, in a closed state, an exhaust valve 27 is opened so that the gas pressure in the chamber 23 is returned to atmospheric pressure. The response time of the electromagnetic valve 26 used is 20 milli-second, and the closing and opening time can be set to a value within the range of 20 milli-second to 1 second.

As a result of control of the amplitude per time unit which is applied to the solder layer 17, using the sealing apparatus shown in FIG. 3, an extremely good effect of hermetic sealing was obtained.

Figure 4A:
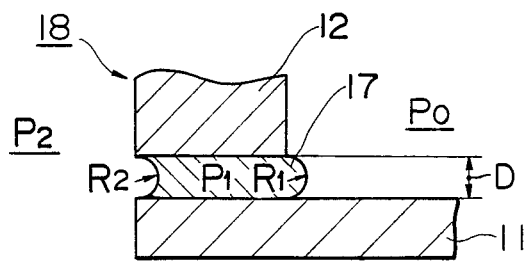
FIG. 4A is a partial cross-sectional view on an enlarged scale, of the joint of the present invention.

FIG. 4A provides and example the solder layer 17 obtained in the step shown in FIG. 2B of the steps shown in FIGS. 2A to 2C. It is assumed that the internal pressure of each of the packages 18 is $P_0$, the internal pressure of the fused solder layer 17 is $P_1$, the external pressure of each of the packages 18 is $P_2$, the surface tension of the fused solder layer 17 is T, and the radii of the spherical solder surfaces produced owing to the difference in pressure between the outside and inside of each of the packages are respectively $R_1$ and $R_2$. In the state shown in FIG. 4A wherein the solder layer 17 is balanced, the following equations (1), (2) and (3) are established:

$$P_1 - P_0 = P_2 - P_1 \quad (1)$$

$$P_1 - P_0 = T/R_1 \quad (2)$$

$$P_2 - P_1 = T/R_2 \quad (3)$$

It can be assumed that, if the width of the solder layer 17 is limited within the width of each sealing plane and the joining solder planes are parallel with each other and have no unnecessary film adhering thereto, $R_1$ substantially equals $R_2$. If each of $R_1$ and $R_2$ substituted by R, $P_2$ can be represented by the following approximate expression (4):

$$P_2 \approx 2T/R + P_0 \quad (4)$$

The above-described expression represents that, if $P_2$ is over the value of $2T/R + P_0$, the solder layer 17 is out of balance and is thus dispersed in each of the packages 18. Since, if the thickness of the solder layer 17 is D, the approximate expression: $D = 2R$ is established, and thus the expression (5) described below is obtained as a condition for preventing any dispersion of the solder $$P_2 < 4T/D + P_0 \quad (5)$$

Figure 4B:
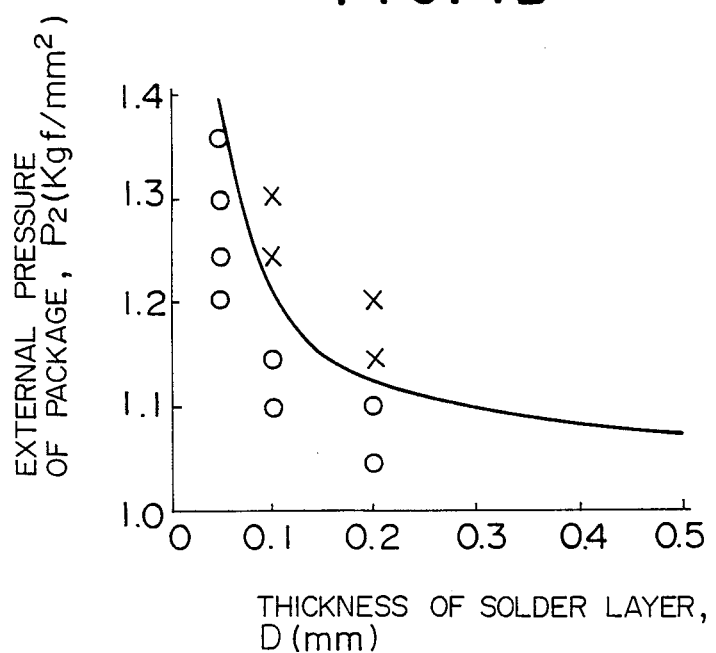
FIG. 4B is a graphical illustration depicting the effect of the present invention.

The values calculated from the expression (5) are shown by the solid line in FIG. 4B. It is therefore possible to obtain a necessary amplitude without dispersing the solder layer 17 under the conditions of combination of $P_2$ and D within the range below the solid line.

On the basis of the above-described relationships sealing experiments were conducted using the external pressure $P_2$ as a parameter ($P_1$ was atmospheric pressure). During the sealing experiments, the electromagnetic valve 26 was opened and closed at a rate of 2 cycles/second, with this operation being repeated for 3 seconds. Although, the pressure was changed 6 cycles, only one cycle of change exhibits the advantageous effect. However, it was found from experiments that the pressure is preferably changed 3 cycles or more, from the viewpoint of reliability. The o marks in FIG. 4B represent the results of experiments in which good hermetic sealing was achieved without producing any dispersion of the solder layer 17. The x marks shown in FIG. 4B represent the results of experiments in which dispersion of the solder occurred. It is found that these results satisfactorily agree with the results estimated from the expression (5) with a high level of reproducibility.

As described above, the use of the hermetic sealing apparatus of the present invention easily enables the control of amplitude conditions which are applied to the sealed solder layer 17 and thus involves the effect that hermetic sealing can be realized with excellent reliability for packages 18 with solder layers 17 having different thicknesses. Alternatively, a rotary air pump (not shown) was used in place of the bomb 24 and the gas pressure in the chamber 23 was reduced to a given value and the chamber 23 was returned to initial pressure. The advantageous effect resulted from this case was the same as the above mentioned effect of the second embodiment. In this case, although the fused solder layer 17 shown in FIG. 4A was moved to the outside of each package 18 when the electromagnetic valve 26 was opened, and it was returned to the initial position when the valve 26 was closed, the effect of increasing the solder wettability and thus improving the hermetic property was the same as that exhibited by the second embodiment.

What is claimed is:

1. A method of integrally joining at least two composite structures using a bonding material meltable under heating, the method comprising the steps of:
   heat-melting said bonding material interposed between said composite structure disposed opposite to each other; and
   changing at least three times a pressure difference between a first pressure of atmospheric gas present in a space on one side of said bonding material in a fused state and a second pressure of other atmospheric gas on an opposite side of the bonding material in a rhythmatic manner.

2. A method of joining composite structures according to claim 1, wherein said bonding material is interposed in a linear form between joints of said opposite composite structures, and the pressure of said gas in one of said spaces is changed.

3. A method of integrally joining at least two composite structures using a bonding material which will melt under heating, comprising the following steps:
   heat-melting said bonding material interposed between said composite structures which are disposed opposite to each other;
   changing at least three times a pressure of atmospehric gas surrounding said bonding material in a fused state in a reciprocative manner between an initial pressure and a pressure different therefrom; and
   solidifying said fused bonding material.

4. A method of joining composite structures according to claim 3, wherein said bonding material is interposed in a linear form between joints of said opposite composite structures.

5. A method of joining composite structures according to claim 3, wherein said atmospheric gas is an inactive gas.

6. A method of joining composite structures according to claim 1, wherein one of said composite structures is a substrate and the other is a cap, said composite structures being integrally joined together to form a hermetically sealed package.

7. A method of joining composite structures according to claim 1, wherein the changing of the pressure difference in a rhythmic manner is achieved in a pulsating manner.

8. A method of joining composite structures according to claim 1, wherein said atmospehric gas is an inactive gas.

9. A method of joining composite structures according to claim 1, wherein one of said composite structures is a substrate and the other is a cap, said composite structure being integrally joined together to form a hermetically sealed package.

* * * * *